US006980064B1

(12) United States Patent
Boulerne

(10) Patent No.: US 6,980,064 B1
(45) Date of Patent: Dec. 27, 2005

(54) SLIDE-SCREW TUNER WITH SINGLE CORRUGATED SLUG

(75) Inventor: Philippe Boulerne, 6980 Lacroix, Montreal, PQ (CA) H4E 2V3

(73) Assignee: Philippe Boulerne, Montreal (CA)

( * ) Notice: Subject to any disclaimer, the term of this patent is extended or adjusted under 35 U.S.C. 154(b) by 0 days.

(21) Appl. No.: 10/894,080

(22) Filed: Jul. 20, 2004

(51) Int. Cl.[7] .......................... H03H 7/38; G01R 27/00
(52) U.S. Cl. .................. 333/17.3; 333/263; 324/637; 324/642
(58) Field of Search .................. 324/76, 49, 76.11, 324/76.51, 642, 637; 333/17.3, 263

(56) References Cited

U.S. PATENT DOCUMENTS 6,515,465 B2 * 2/2003 Kiyokawa et al. ....... 324/76.49
6,674,293 B1 * 1/2004 Tsironis ..................... 324/638

* cited by examiner

Primary Examiner—Stephen E. Jones

(57) ABSTRACT

The present invention discloses a load-pull slide-screw tuner consisting of a radio-frequency (RF) or microwave slotted airline (slabline) containing a single corrugated RF slug, said corrugated RF slug being controlled horizontally and vertically by remote electric control, allowing the creation of impedances which are distributed over and cover the entire Smith chart, from perfect transparency to high reflection factors. The corrugation structure of the RF slug of this invention provides the slide-screw tuner, with a single RF slug, the same electromagnetic performances than double slugs slide-screw tuner, i.e. same frequency bandwidth of use and equivalent high gamma performances, at a much lower cost of manufacturing.

4 Claims, 6 Drawing Sheets

SLIDE-SCREW TUNER WITH SINGLE CORRUGATED SLUG

CROSS REFERENCE TO RELATED APPLICATIONS

U.S. Patent Documents
 U.S. Pat. No. 3,851,271; November, 1974; Cooke et al.; 331/47
 U.S. Pat. No. 4,267,532; May, 1981; Salch; 333/33
 U.S. Pat. No. 4,535,307; August, 1985; Tsukii; 333/35
 U.S. Pat. No. 4,751,480; June, 1988; Kunz et al; 333/129
 U.S. Pat. No. 5,079,507; January, 1992; Ishida et al.; 324/645
 U.S. Pat. No. 5,363,060; November, 1994; Kohno; 330/286
 U.S. Pat. No. 5,406,060; April, 1995; Mikami et al,; 330/277
 U.S. Pat. No. 6,297,649; Oct. 2, 2001; Tsironis; 324/642
 U.S. Pat. No. 6,674,293; Jan. 6, 2004; Tsironis; 324/638

Other References
LANGE Julius, Microwave Transistor Characterization Including S-Parameters, Texas Instruments, in Hewlett Packard Application Note 95
KESHISHIAN Richard, VSWR Tuner, MACOM Application Note AN0004
CUSACK Joseph M., PERLOW Stewart M., PERLMAN Barry S., Automatic Load Contour Mapping for Microwave Power Transistors; IEEE Transactions on Microwave Theory and Techniques, vol. MMT-22, No. 12, December 1974, pp1146–1152.
SECHI F., PAGLIONE R., PERLMAN B., BROWN J., A Computer-Controlled Microwave Tuner for Automated Load Pull, RCA Review, vol. 44 December 1983, pp 566–583.
PERLOW Stewart M., New Algorithms for the Automated Microwave Tuner System, RCA Review, vol. 46, September 1985, pp 341–355.
Patent Application Publication, U.S. 2003/0122633 A1, Jul. 3, 2003, Chistos Tsironis, "High Frequency, High Reflection Pre-Matching Tuners with Variable Zero Initialization"
Patent Application Publication, U.S. 2004/0119481 A1, Jun. 24, 2004, Chistos Tsironis, "Microwave Tuners for Wideband High Reflection Applications"

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISK APPENDIX

Not Applicable

BACKGROUND OF THE INVENTION

1. Field of the Invention

The present invention relates to an electromechanical slide-screw tuner system, and more particularly to such a system to be used in load-pull setup for the measurement, characterization and testing of RF or microwave devices. RF/Microwave tuners are electronic devices or mechanical devices which modify in a predictable way the complex impedance seen by the device under test (hereinafter referred to as "DUT") at a given frequency of operation. The impedance tuner has the capability of generating impedance to the microwave devices close to the conjugate complex of the DUT's internal impedance. This technique of subjecting DUT to variable load impedance or variable source impedance with corresponding load tuner and source tuner, commonly referred to as "load pull", is used to test transistors for amplifier, oscillator or frequency multiplier applications.

2. Description of Prior Art

The automatic single RF slug slide-screw tuner consists of a housing (1), a coaxial 50 ohm characteristic impedance transmission line (2,72), center conductor (3,73), two slabs as outer conductor ground return (72) and uses a single RF slug (5,70), movable in horizontal and vertical direction into a transmission line. The principle of slide-screw tuners has been first described by LANGE Julius in "Microwave Transistor Characterization Including S-Parameters", Texas Instruments, Hewlett Packard Application Note 95. The main disadvantages of slide-screw tuner are power limitations and high gamma accuracy limitations when it comes to high gamma. Power limitations are due to corona discharges that can take place between the tuning metallic slug (70) and the central conductor (73) at low impedance, i.e. high gamma. The greater the distance between the metallic slug and the central conductor, the more power can be transmitted, and conversely, the smaller the distance, the less power can be transmitted mainly because of corona discharge. Accuracy limitations also at low impedance are because of mechanical limitations to reproduce accurately a given slug position close to the central conductor, position where sub-micron precision is required.

One enhancement of single slug slide-screw tuner is disclosed in CA Pat. No. 2,311,620 and U.S. Pat. No. 6,674,293 issued to Christos Tsironis on Jan. 6, 2004, which relates to a double slug slide-screw tuner that comprises a housing (51), a first (54) and a second (54') carriages, said carriages are controlling a first (55) and a second (55') RF slugs in series in a transmission line (52), said first slug is adapted to act as a pre-matching section and said second slug is adapted to act as a tuning section. This tuner requires an additional sub-micron vertical positioning system for the second slug compared with the central conductor (53) which increases considerably the mechanical construction difficulty and the manufacturing cost. Another shortcoming of this solution is described in the said patent, the technique being in reality two independent tuners connected in series, the combined calibration time may be too long for practical considerations. Consequently, the patent provides alternative methods for calibrating the tuner to cut down the calibration time. But these calibration methods are based on approximations and will therefore give limited accuracy for the measurements.

The dilemma is how to keep the simplicity of operation of the slide-screw tuner and be able to reach high reflection factors, typically gamma above 0.95, required for today's low impedance transistors, without compromising too much on the power level and the accuracy of the measurements.

BRIEF SUMMARY OF THE INVENTION

The problem remaining in the prior art has been solved in accordance with the present invention which relates to a class of mechanical slide-screw tuner comprising a slab-line, a single corrugated RF slug, which horizontal and vertical positions are being controlled by electrical motors. The corrugation structure of the slug is increasing the maximum reflection achievable compared to prior art according to the transmission line theory, without the necessity of going very close to the central conductor of the transmission line.

DETAILED DESCRIPTION OF THE INVENTION

Figure 6:
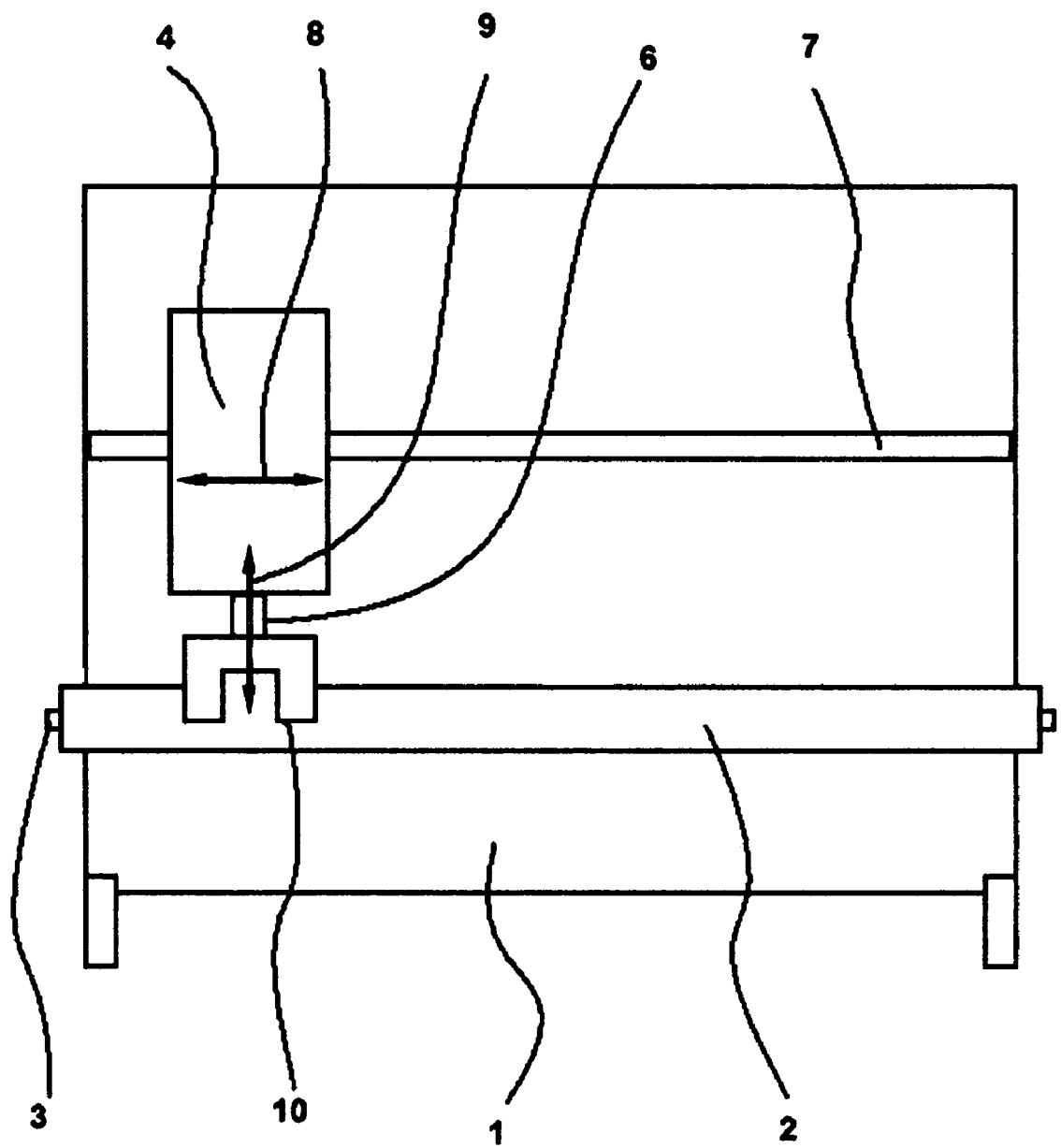
FIG. 6: Depicts a single slug slide-screw tuner structure with corrugated RF slug

The slide-screw tuner, described by FIG. 6, consists of a housing (1), a slab-line (2) with a characteristic impedance Z0. The slab-line contains a single corrugated RF slug (10), that slide between the inner conductor (3,73) and the outer conductor (2,72). The corrugated RF slug is mechanically linked to a mobile carriage (4) with a mechanical link (6,101). The corrugated RF slug is horizontally positioned in the slab-line by the position of said mobile carriage (4), shown by arrows (8,103), which is driven by a lateral mechanism such as driving screw (7). The corrugated RF slug is vertically positioned in the slab-line by an electrical motor on the said mobile carriage (4), shown by arrows (9,102).

Figure 1:
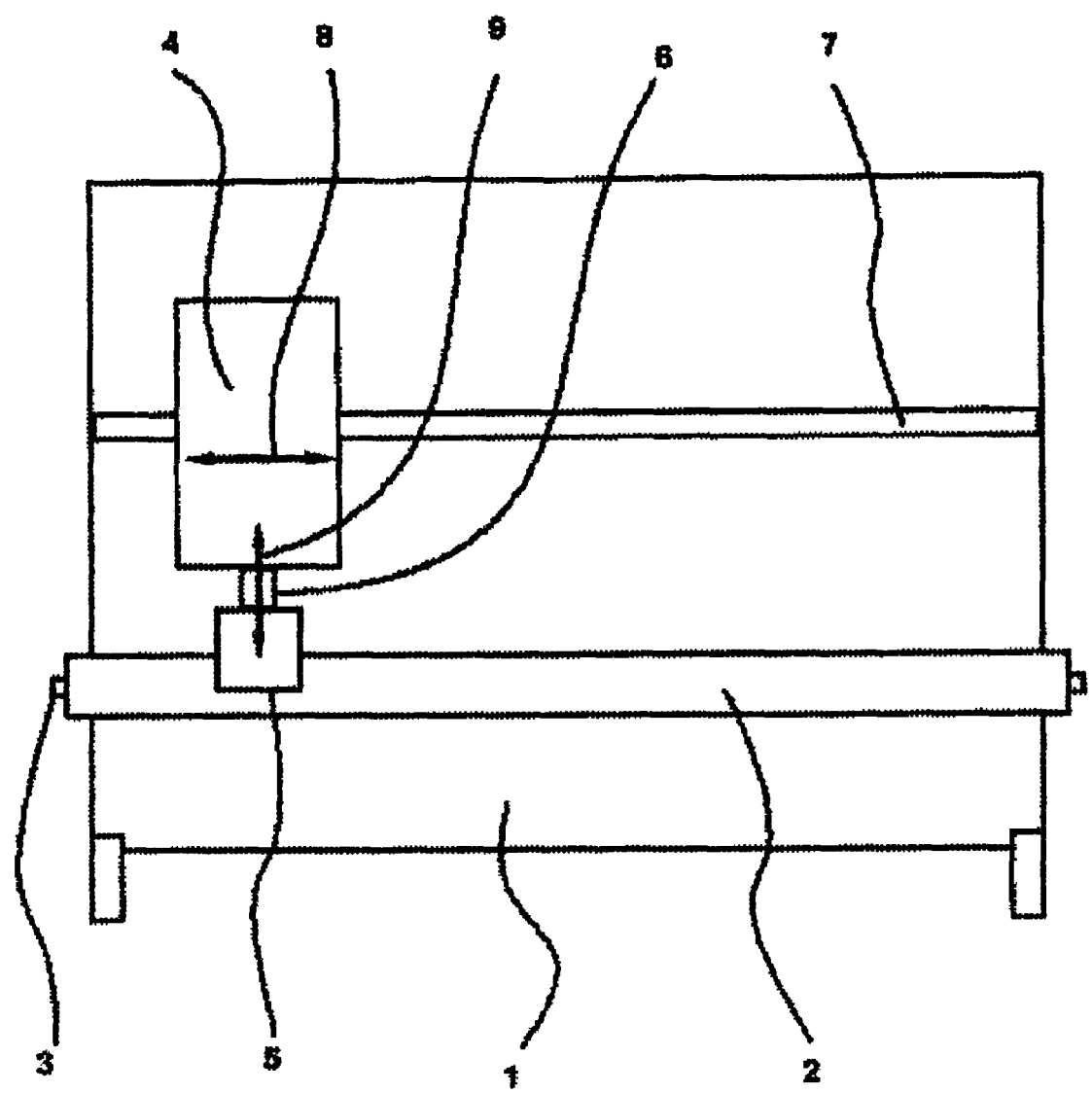
FIG. 1: (Prior Art) depicts a single RF slug slide-screw tuner structure
Figure 2:
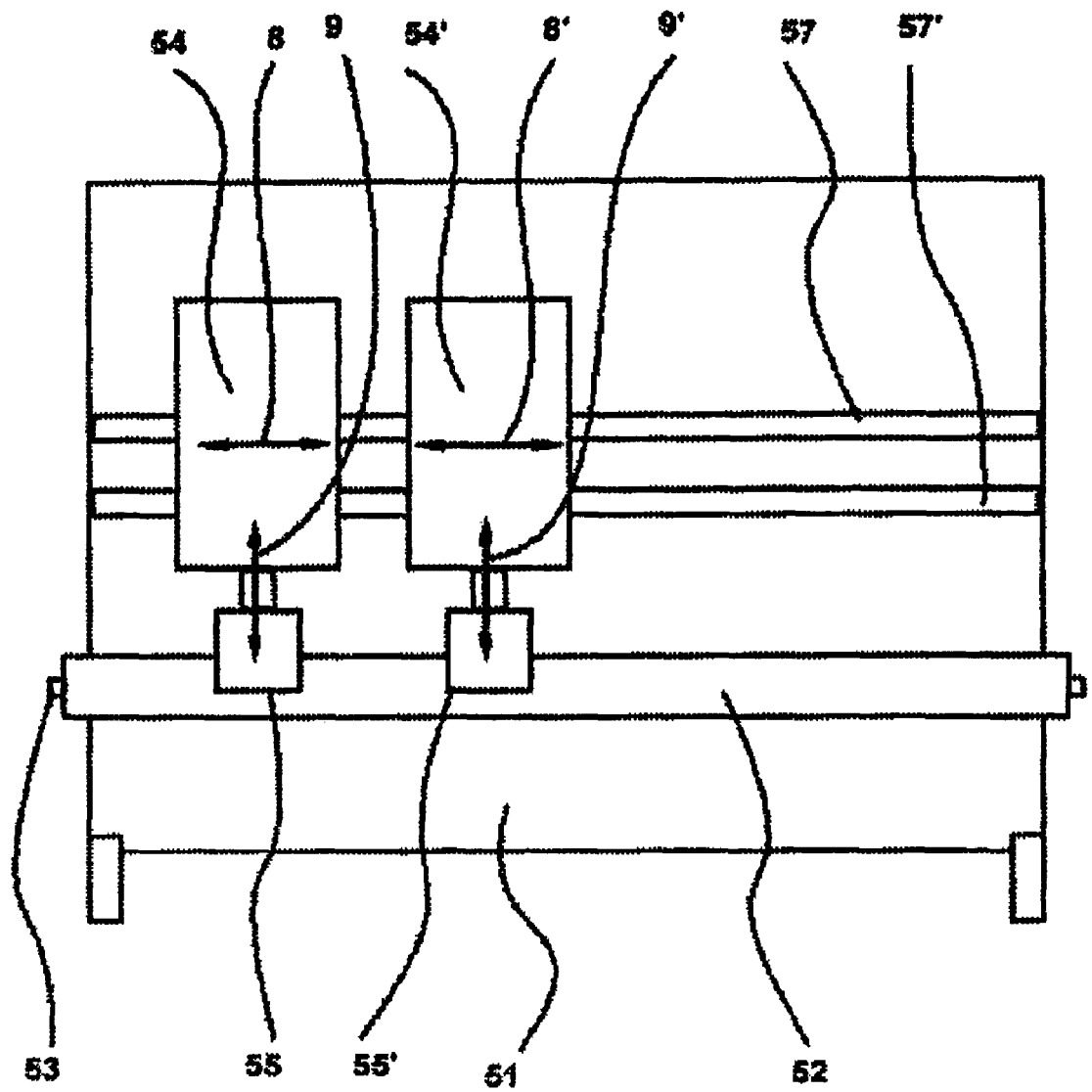
FIG. 2: (Prior Art) depicts a double RF slug slide-screw tuner structure
Figure 3A:
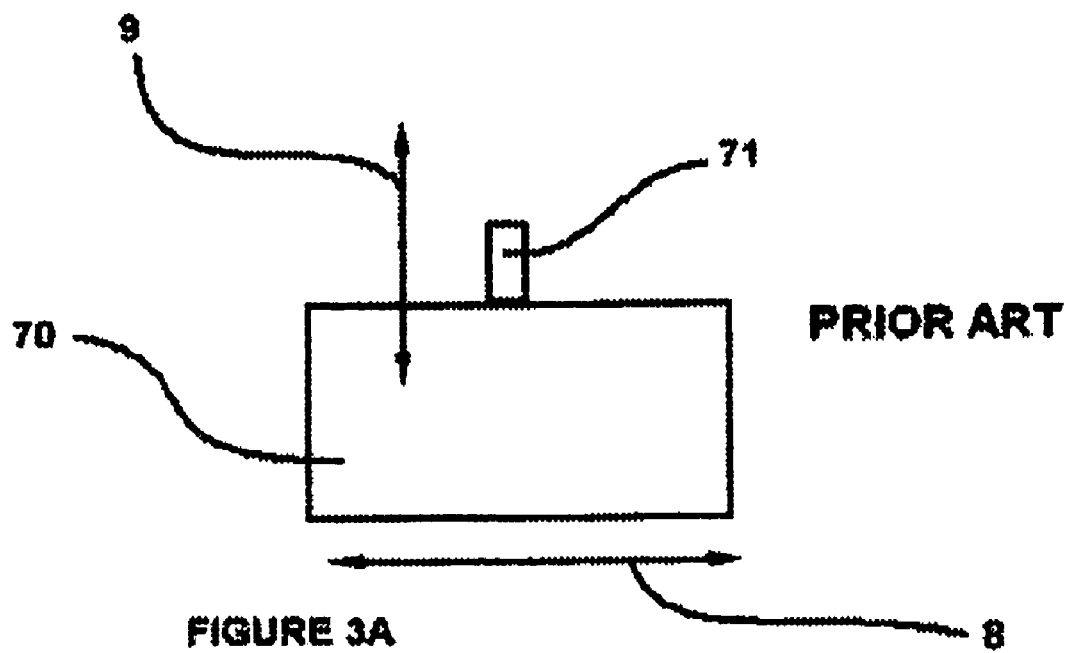
FIG. 3A: (Prior Art) depicts a longitudinal view of a parallelepipedic RF slug
Figure 3B:
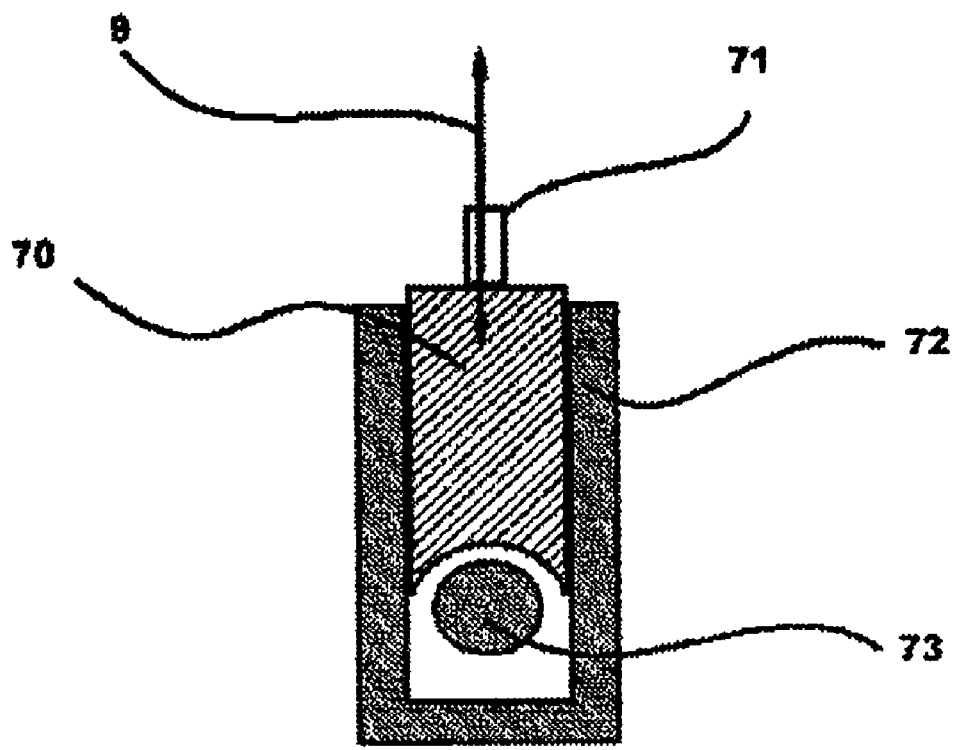
FIG. 3B: depicts a transversal cross-sectional view of a parallelepipedic RF slug into a transmission line
Figure 4A:
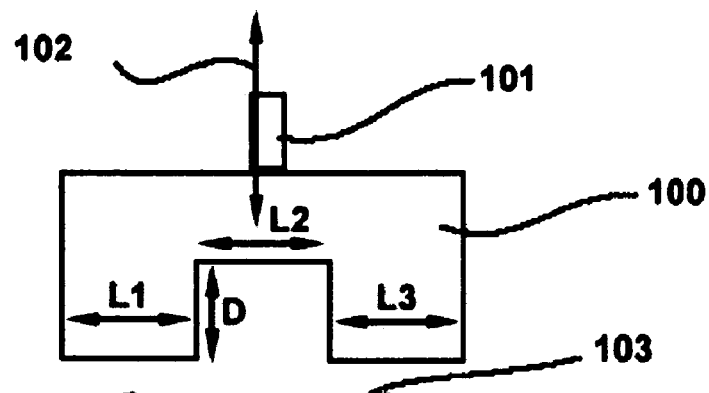
FIG. 4A: depicts a RF slug with a corrugation structure of one slot
Figure 4B:
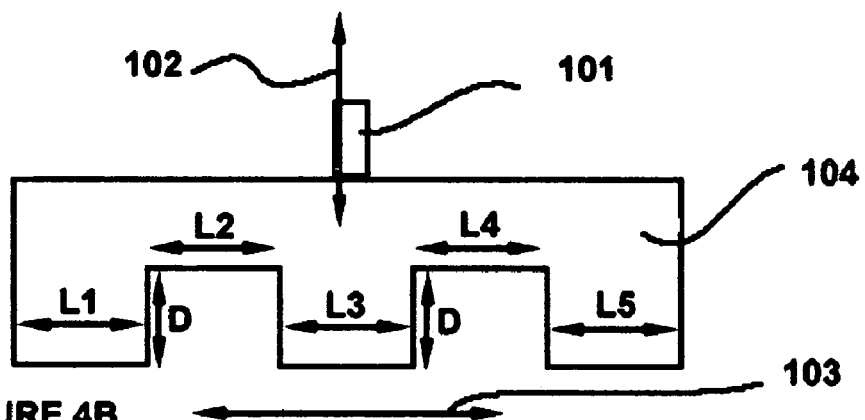
FIG. 4B: depicts a RF slug with a corrugation structure of two slots
Figure 4C:
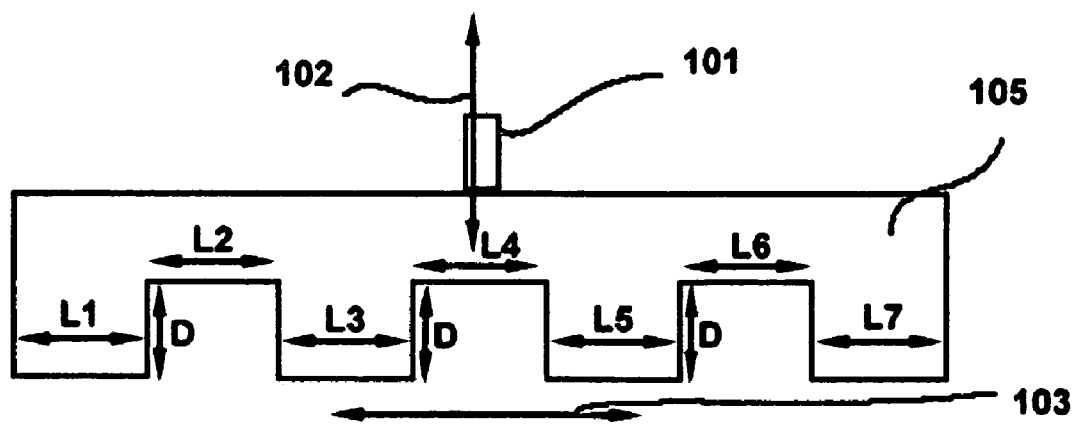
FIG. 4C: depicts a RF slug with a corrugation structure of three slots
Figure 5A:
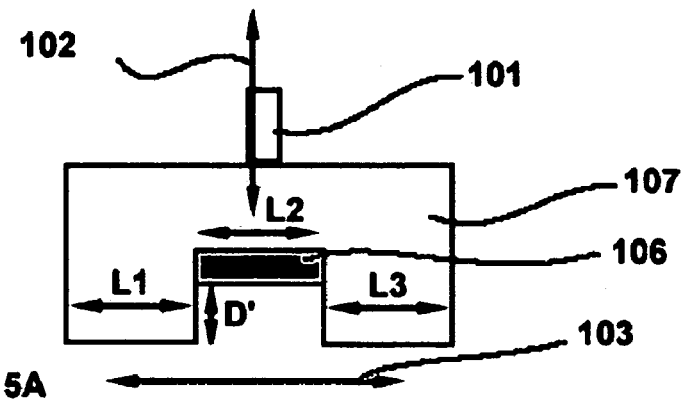
FIG. 5A: depicts a RF slug with a corrugation structure of one slot, said slot being partially filled with absorbing material or dielectric
Figure 5B:
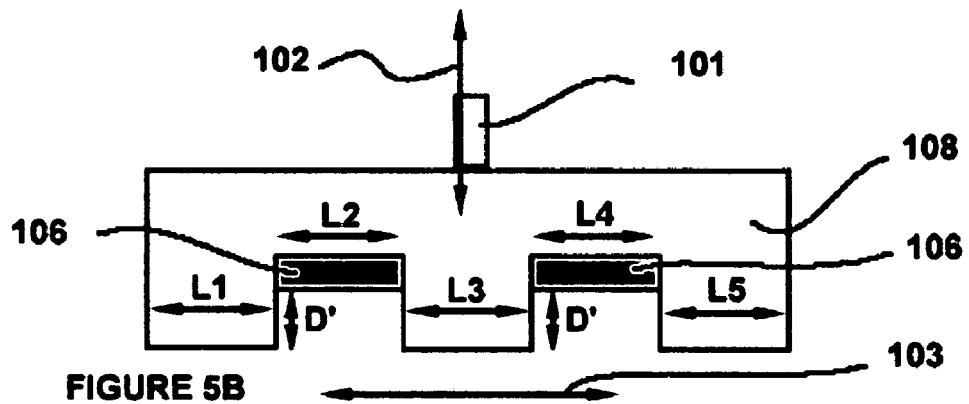
FIG 5B: depicts a RF slug with a corrugation structure of two slots, said slots being partially filled with absorbing material or dielectric
Figure 5C:
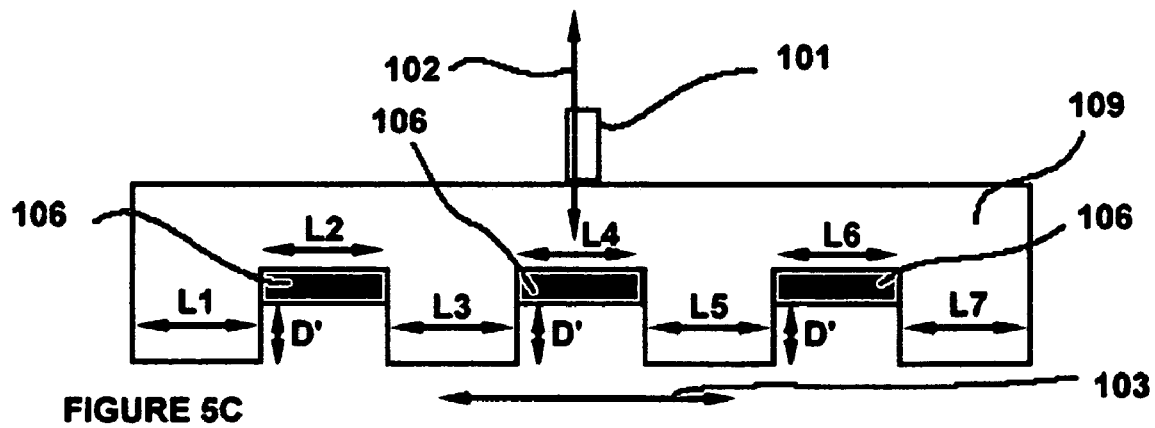
FIG. 5C: depicts a RF slug with a corrugation structure of three slots, said slots being partially filled with absorbing material or dielectric

The corrugated slugs are described by FIGS. 4A, 4B, 4C, 5A, 5B and 5C. The corrugation structure can have a plurality of slots, said slots being arranged in a direction perpendicular to the longitudinal of the slab-line. As for examples, FIGS. 4A and 5A depict a corrugation structure with a single slot of width L2, while FIGS. 4B and 5B depict a corrugation structure with two slots of width L2 and L4, and FIGS. 4C and 5C depict a corrugation structure with three slots of width L2, L4 and L6. The said slots having a depth D, said depth being deep enough in order for the slots to provide an equivalent transmission line impedance close to Z0, Z0 being the impedance of the transmission line. The sections of transmission line containing the slots (L2, L4, . . . ) of the corrugation should have a characteristic impedance as close as possible to Z0 independently of the vertical position of the RF slug, while the sections of transmission line containing the peaks (L1,L3, . . . ) of the corrugation, have a variable characteristic impedance ZS depending on the vertical position of the RF slug in the transmission line. The slots can be partially or fully filled with absorbing material or with dielectric (106) in order for the slot to reach the Z0 impedance of the transmission line with a deep D smaller than if the slots were only filled with air. The corrugation structure of the RF slug provides a cascading structure of transmission line of impedances Z0 and ZS equivalent to what can be achieved with multi-slug slide-screw tuners.

For example, equivalent performances of double slug slide-screw tuner can be realized with a slug like the one shown in FIG. 4A, where L1=L2=L3=a quarter of the wave length of the working frequency. It is well known from the transmission line theory that the maximum reflection occurs when the two peaks width and the slot width are an odd multiple of a quarter wavelength of the working frequency. In order to increase the maximum reflection, it is also possible to increase the number of corrugations, like the slug described in FIG. 4B with three corrugations or the slug described in FIG. 4C with four corrugations, which is much easier than increasing the number of slugs, carriages and motors required by multiple slugs slide-screw tuners.

It is to note that this invention does not limit the number of corrugations. It is also to note that this invention does not constraint the different width of the peaks, neither the width of the slots of the corrugation. Since for corrugated slugs, in the contrary of double slug tuners described in the previous art where the slugs spacing is controllable, all dimensions are fixed, the slide-screw tuner of this invention will be supplied as a kit with a plurality of corrugated slugs, each slug being optimized in number of corrugations, in slots width (L2,L4, . . . ) and peaks width (L1,L3, . . . ) in order to fit different requirements. The two major criteria for optimising the number of corrugations, optimising the width of the peaks and optimising the width of the slots are frequency bandwidth of operation and maximum achievable reflection within the said frequency bandwidth, both being defined by customer requirements. Different slugs dimensions corresponding to different constraints optimisation will be supplied within the said kit.

An important benefit of using a single corrugated RF slug in the slide-screw tuner instead of using a double slug slide-screw tuner, is that the existing calibration method that is used for single slug (70) slide-screw tuner requires no modification when the slug (70) is replaced by a corrugated slug (100,104,105,107,108,109). Also the tuning algorithm with the corrugated RF slug is identical than the tuning algorithm previously used in prior art.

Yet another important benefit of using the single corrugated RF slug slide-screw tuner instead of the double slug slide-screw tuner, is that the impedance synthesizing is non-ambiguous with single slug slide-screw tuner, which is not the case of double slug slide-screw tuners with its 4-axis of freedom (8,8',9,9'). Different strategies to reduce the number of axis of freedom to 2 have been proposed to solve this problem, like the one proposed in U.S. Pat. No. 6,674,293, issued to Christos Tsironis, where the first slug is prematching (55) and the second slug is tuning (55'), or this other solution proposed in U.S. Patent 2004/0119481 A1, issued to Christos Tsironis, where the synchronization of the two slugs has been proposed, requiring on top of the additional carriage, extra synchronization mechanism in order to achieve the simultaneous vertical and horizontal movement of the two slugs and a manual control procedure to manually align the synchronism.

Although the present invention has been explained hereinabove by way of a preferred embodiment thereof, it should be pointed out that any modifications to this preferred embodiment within the scope of the appended claims is not deemed to alter of change the nature and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. An electromechanical slide-screw tuner having an input and an output, comprising a transmission line with longitudinal axis, in which a single corrugated slug is moved in, out and along of said transmission line by means of electrical remote control, in such a way as for the physical vertical distance between the said corrugated slug and the center conductor of said transmission line to be remotely adjustable from a maximum of at least two times the diameter of the said center conductor of said transmission line to a minimum distance of zero, said minimum distance corresponding to physical contact between said corrugated slug and said center conductor and in which the physical horizontal position of said corrugated slug is adjustable from a minimum zero to a maximum of one half of a wavelength at the lowest frequency of operation, said corrugated slug having a curved slotted portion in relationship with the transmission line and a corrugation structure comprising at least one slot, said at least one slot being arranged in a direction perpendicular to said longitudinal axis of said transmission line.

2. An electromechanical slide-screw tuner as in claim 1, where the said electrical remote control comprises two electrical motors, one for the perpendicular movement to the said longitudinal axis of said transmission line and one for the parallel movement to the said longitudinal axis of said transmission line.

3. A corrugation structure as in claim 1, where the said at least one slot is being partially filled with RF or microwave absorbing material.

4. A corrugation structure as in claim 1, where the said at least one slot is being partially filled with dielectric material.

* * * * *